(12) United States Patent
Hayakawa et al.

(10) Patent No.: US 10,297,395 B2
(45) Date of Patent: *May 21, 2019

(54) SOLAR CELL

(71) Applicant: SEKISUI CHEMICAL CO., LTD., Osaka (JP)

(72) Inventors: Akinobu Hayakawa, Osaka (JP); Motohiko Asano, Osaka (JP); Tomohito Uno, Osaka (JP); Mayumi Horiki, Osaka (JP); Yuuichirou Fukumoto, Osaka (JP); Tetsuya Kurebayashi, Osaka (JP); Shunji Ohara, Osaka (JP)

(73) Assignee: SEKISUI CHEMICAL CO., LTD., Osaka (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/514,907

(22) PCT Filed: Oct. 14, 2015

(86) PCT No.: PCT/JP2015/079090
§ 371 (c)(1),
(2) Date: Mar. 28, 2017

(87) PCT Pub. No.: WO2016/060182
PCT Pub. Date: Apr. 21, 2016

(65) Prior Publication Data
US 2017/0236652 A1    Aug. 17, 2017

(30) Foreign Application Priority Data

Oct. 14, 2014  (JP) .................... 2014-210192

(51) Int. Cl.
*H01G 9/20*  (2006.01)
*H01L 51/44*  (2006.01)
*H01L 51/42*  (2006.01)

(52) U.S. Cl.
CPC ......... *H01G 9/2009* (2013.01); *H01G 9/2077* (2013.01); *H01L 51/4253* (2013.01);
(Continued)

(58) Field of Classification Search
CPC .................. H01G 9/2077; H01G 9/2009; H01L 51/4253; H01L 51/448
See application file for complete search history.

(56) References Cited

U.S. PATENT DOCUMENTS

2010/0071743 A1*  3/2010  Yamanaka ........... H01G 9/2081
                                                                 136/244
2010/0272933 A1   10/2010  McCormick et al.
(Continued)

FOREIGN PATENT DOCUMENTS

CN           1992371        7/2007
CN         102544055        7/2012
(Continued)

OTHER PUBLICATIONS

Matthew O. Reese et al., "Photoinduced Degradation of Polymer and Polymer-Fullerene Active Layers: Experiment and Theory", Advanced Functional Materials, vol. 20, 2010, pp. 3476-3483.
(Continued)

*Primary Examiner* — Matthew T Martin
(74) *Attorney, Agent, or Firm* — Wenderoth, Lind & Ponack L.L.P.

(57) ABSTRACT

An object of the present invention is to provide a solar cell that is excellent in photoelectric conversion efficiency, suffers little degradation during encapsulation (initial degradation), has high-humidity durability, and is excellent in temperature cycle resistance. The present invention provides a solar cell including: a laminate having an electrode, a counter electrode, and a photoelectric conversion layer disposed between the electrode and the counter electrode; and
(Continued)

an encapsulation material covering the counter electrode to encapsulate the laminate, the photoelectric conversion layer including an organic-inorganic perovskite compound represented by the formula: $R\text{-}M\text{-}X_3$, R representing an organic molecule, M representing a metal atom, X representing a halogen atom or a chalcogen atom, the encapsulation material including a resin having at least one skeleton selected from the group consisting of polyisobutylene, polyisoprene, and polybutadiene.

3 Claims, 1 Drawing Sheet

(52) U.S. Cl.
CPC ............ *H01L 51/44* (2013.01); *H01L 51/448* (2013.01); *Y02E 10/542* (2013.01); *Y02E 10/549* (2013.01)

(56) References Cited

U.S. PATENT DOCUMENTS

| | | | |
|---|---|---|---|
| 2011/0045287 A1 | 2/2011 | Kawashima et al. | |
| 2012/0199201 A1 | 8/2012 | Seike et al. | |
| 2012/0211078 A1 | 8/2012 | Kato et al. | |
| 2012/0260980 A1* | 10/2012 | Igarashi | H01G 9/2077 136/256 |
| 2014/0137939 A1 | 5/2014 | Higashi | |
| 2015/0228415 A1* | 8/2015 | Seok | H01G 9/2031 136/256 |

FOREIGN PATENT DOCUMENTS

| | | |
|---|---|---|
| CN | 102668155 | 9/2012 |
| CN | 102737848 | 10/2012 |
| CN | 103956375 | 7/2014 |
| EP | 2 498 330 | 9/2012 |
| EP | 3 276 694 | 1/2018 |
| JP | 2004-165512 | 6/2004 |
| JP | 2006-344794 | 12/2006 |
| JP | 2012-89663 | 5/2012 |
| JP | 2013-254992 | 12/2013 |
| JP | 2014-56940 | 3/2014 |
| WO | 2009/125685 | 10/2009 |
| WO | 2011/052573 | 5/2011 |
| WO | 2011/062932 | 5/2011 |
| WO | 2012/056941 | 5/2012 |
| WO | 2013/171520 | 11/2013 |
| WO | 2014/042449 | 3/2014 |

OTHER PUBLICATIONS

G. Schwartz et al., "Efficient and long-term stable organic vacuum deposited tandem solar cells", Proceedings of SPIE, vol. 7416, 2009, pp. 74160K-1-74160-K11.

International Preliminary Report on Patentability dated Apr. 18, 2017 in corresponding International (PCT) Application No. PCT/JP2015/079090.

International Search Report dated Dec. 8, 2015 in corresponding International (PCT) Application No. PCT/JP2015/079090.

International Preliminary Report on Patentability dated Apr. 18, 2017 in International (PCT) Application No. PCT/JP2015/079005.

International Search Report dated Dec. 8, 2015 in International (PCT) Application No. PCT/JP2015/079005.

Extended European Search Report dated May 14, 2018 in European Patent Application No. 15850500.8.

Extended European Search report dated May 18, 2018 in European Patent Application No. 15850457.1.

Ramos et al., "Fabrication and encapsulation of perovskites sensitized solid state solar cells", pp. 2584-2587, IEEE Jun. 2014.

* cited by examiner

SOLAR CELL

TECHNICAL FIELD

The present invention relates to a solar cell that is excellent in photoelectric conversion efficiency, suffers little degradation during encapsulation (initial degradation), has high-humidity durability, and is excellent in temperature cycle resistance.

BACKGROUND ART

Photoelectric conversion elements equipped with a laminate having an N-type semiconductor layer and a P-type semiconductor layer disposed between opposing electrodes have been conventionally developed. Such photoelectric conversion elements generate photocarriers by photoexcitation so that electrons and holes move through the N-type semiconductor and the P-type semiconductor, respectively, to create an electric field.

Most photoelectric conversion elements currently in practical use are inorganic solar cells which are produced using inorganic semiconductors made of silicon or the like. The inorganic solar cells, however, are utilized only in a limited range because their production is costly and upsizing thereof is difficult. Therefore, organic solar cells produced using organic semiconductors instead of inorganic semiconductors have received attention.

In organic solar cells, fullerene is used in most cases. Fullerene is known to function mainly as an N-type semiconductor. For example, Patent Literature 1 discloses a semiconductor heterojunction film formed using an organic compound serving as a P-type semiconductor, and fullerenes. Fullerene, however, is known to be responsible for degradation of organic solar cells produced using the fullerene (see e.g., Non-Patent Literature 1). Thus, there is a demand for a material that substitutes for fullerene.

In the organic solar cells, a laminate having an N-type semiconductor layer and a P-type semiconductor layer disposed between opposing electrodes is generally encapsulated using an encapsulation resin such as a sealing material (see e.g., Non-Patent Literature 2). However, the problem of the organic solar cells encapsulated using an encapsulation resin such as a sealing material is that, depending on the type of a semiconductor material, the semiconductor material is degraded during encapsulation, resulting in reduced photoelectric conversion efficiency (initial degradation).

CITATION LIST

Patent Literature

Patent Literature 1: JP 2006-344794 A

Non-Patent Literature

Non-Patent Literature 1: Reese et al., Adv. Funct. Mater., 20, 3476-3483 (2010)
Non-Patent Literature 2: Proc. of SPIE, Vol. 7416, 74160K-1

SUMMARY OF INVENTION

Technical Problem

An object of the present invention is to provide a solar cell that is excellent in photoelectric conversion efficiency, suffers little degradation during encapsulation (initial degradation), has high-humidity durability, and is excellent in temperature cycle resistance.

Solution to Problem

The present invention provides a solar cell including: a laminate having an electrode, a counter electrode, and a photoelectric conversion layer disposed between the electrode and the counter electrode; and an encapsulation material covering the counter electrode to encapsulate the laminate, the photoelectric conversion layer including an organic-inorganic perovskite compound represented by the formula: $R-M-X_3$, R representing an organic molecule, M representing a metal atom, X representing a halogen atom or a chalcogen atom, the encapsulation material including a resin having at least one skeleton selected from the group consisting of polyisobutylene, polyisoprene, and polybutadiene.

Hereinafter, the present invention will be described in detail.

The present inventor studied use of a particular organic-inorganic perovskite compound for a photoelectric conversion layer in a solar cell in which a laminate having an electrode, a counter electrode, and a photoelectric conversion layer disposed between the electrode and the counter electrode is encapsulated with an encapsulation material. Use of the organic-inorganic perovskite compound can be expected to improve the photoelectric conversion efficiency of the solar cell.

However, encapsulation of a laminate including a photoelectric conversion layer containing the organic-inorganic perovskite compound with a conventional encapsulation material was found to reduce the photoelectric conversion efficiency during the encapsulation (initial degradation).

The present inventors conducted intensive studies on the cause of degradation that occurs when a laminate including a photoelectric conversion layer using an organic-inorganic perovskite compound is encapsulated with an encapsulation material. The present inventors consequently found that this problem arises because, during encapsulation, an organic component in the organic-inorganic perovskite compound is dissolved into the encapsulation material so that the organic-inorganic perovskite compound is degraded.

The present inventors conducted diligent studies to consequently find that use of a resin having at least one skeleton selected from the group consisting of polyisobutylene, polyisoprene, and polybutadiene as the encapsulation material can prevent an organic component in the organic-inorganic perovskite compound from being eluted during encapsulation. The present inventor further found that use of a resin having at least one skeleton selected from the group consisting of polyisobutylene, polyisoprene, and polybutadiene as the encapsulation material can also improve the high-humidity durability and temperature cycle resistance of the resulting solar cell. On the basis of these findings, the present invention has been completed.

The solar cell of the present invention includes: a laminate having an electrode, a counter electrode, and a photoelectric conversion layer disposed between the electrode and the counter electrode; and an encapsulation material covering the counter electrode to encapsulate the laminate.

The term "layer" as used herein means not only a layer having a clear boundary, but even a layer having a concentration gradient in which contained elements are gradually changed. The elemental analysis of the layer can be conducted, for example, by FE-TEM/EDS analysis and measurement of the cross section of the solar cell to confirm the element distribution of a particular element. The term "layer" as used herein means not only a flat thin film-shaped layer, but also a layer capable of forming an intricate structure together with other layer(s).

The materials of the electrode and the counter electrode are not particularly limited, and conventionally known materials may be used. The counter electrode is often a patterned electrode.

Examples of the materials of the electrode and the counter electrode include fluorine-doped tin oxide (FTO), sodium, sodium-potassium alloys, lithium, magnesium, aluminum, magnesium-silver mixtures, magnesium-indium mixtures, aluminum-lithium alloys, Al/Al$_2$O$_3$ mixtures, Al/LiF mixtures, metals such as gold, CuI, conductive transparent materials such as indium tin oxide (ITO), SnO$_2$, aluminum zinc oxide (AZO), indium zinc oxide (IZO) and gallium zinc oxide (GZO), and conductive transparent polymers. These materials may be used alone or may be used in combination of two or more thereof.

The electrode and the counter electrode may each be either a cathode or an anode.

The photoelectric conversion layer includes an organic-inorganic perovskite compound represented by the formula R-M-X$_3$ wherein R represents an organic molecule, M represents a metal atom, and X represents a halogen atom or a chalcogen atom.

Use of the organic-inorganic perovskite compound in the photoelectric conversion layer can improve the photoelectric conversion efficiency of the solar cell.

The R is an organic molecule and is preferably represented by C$_l$N$_m$H$_n$ (l, m and n each represent a positive integer).

Specific examples of the R include methylamine, ethylamine, propylamine, butylamine, pentylamine, hexylamine, dimethylamine, diethylamine, dipropylamine, dibutylamine, dipentylamine, dihexylamine, trimethylamine, triethylamine, tripropylamine, tributylamine, tripentylamine, trihexylamine, ethylmethylamine, methylpropylamine, butylmethylamine, methylpentylamine, hexylmethylamine, ethylpropylamine, ethylbutylamine, formamidine, guanidine, imidazole, azole, pyrrole, aziridine, azirine, azetidine, azete, azole, imidazoline, carbazole and their ions (e.g., methylammonium (CH$_3$NH$_3$)), and phenethylammonium. Among them, methylamine, ethylamine, propylamine, butylamine, pentylamine, hexylamine, formamidine, guanidine and their ions, and phenethylammonium are preferred, and methylamine, ethylamine, propylamine, formamidine, guanidine and their ions are more preferred.

The M is a metal atom. Examples thereof include lead, tin, zinc, titanium, antimony, bismuth, nickel, iron, cobalt, silver, copper, gallium, germanium, magnesium, calcium, indium, aluminum, manganese, chromium, molybdenum, and europium. These metal atoms may be used alone or may be used in combination of two or more thereof.

The X is a halogen atom or a chalcogen atom. Examples thereof include chlorine, bromine, iodine, sulfur, and selenium. These halogen atoms or chalcogen atoms may be used alone or may be used in combination of two or more thereof. Among them, a halogen atom is preferred because the organic-inorganic perovskite compound containing halogen in the structure is soluble in an organic solvent and is usable in an inexpensive printing method or the like. In addition, iodine is more preferred because the organic-inorganic perovskite compound has a narrow energy band gap.

The organic-inorganic perovskite compound preferably has a cubic structure where the metal atom M is placed at the body center, the organic molecule R is placed at each vertex, and the halogen atom or chalcogen atom X is placed at each face center.

Figure 1:
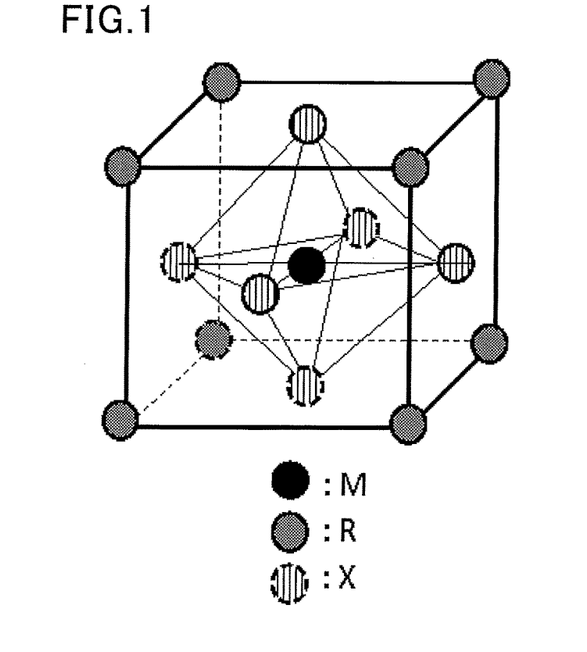
FIG. 1 is a schematic view illustrating an exemplary crystal structure of the organic-inorganic perovskite compound.

FIG. 1 is a schematic view illustrating an exemplary crystal structure of the organic-inorganic perovskite compound having a cubic structure where the metal atom M is placed at the body center, the organic molecule R is placed at each vertex, and the halogen atom or chalcogen atom X is placed at each face center. Although details are not clear, it is presumed that the direction of an octahedron in the crystal lattice can be easily changed owing to the structure; thus the mobility of electrons in the organic-inorganic perovskite compound is enhanced, improving the photoelectric conversion efficiency of the solar cell.

The organic-inorganic perovskite compound is preferably a crystalline semiconductor. The crystalline semiconductor means a semiconductor whose scattering peak can be detected by the measurement of X-ray scattering intensity distribution. When the organic-inorganic perovskite compound is a crystalline semiconductor, the mobility of electrons in the organic-inorganic perovskite compound is enhanced, improving the photoelectric conversion efficiency of the solar cell.

The degree of crystallinity can also be evaluated as an index of crystallization. The degree of crystallinity can be determined by separating a crystalline substance-derived scattering peak from an amorphous portion-derived halo, which are detected by X-ray scattering intensity distribution measurement, by fitting, determining their respective intensity integrals, and calculating the ratio of the crystalline portion to the whole.

The lower limit of the degree of crystallinity of the organic-inorganic perovskite compound is preferably 30%. When the degree of crystallinity is 30% or more, the mobility of electrons in the organic-inorganic perovskite compound is enhanced, improving the photoelectric conversion efficiency of the solar cell. The lower limit of the degree of crystallinity is more preferably 50%, further preferably 70%.

Examples of the method for increasing the degree of crystallinity of the organic-inorganic perovskite compound include heat annealing, irradiation with light having strong intensity, such as laser, and plasma irradiation.

The photoelectric conversion layer may further include an organic semiconductor or an inorganic semiconductor, in addition to the organic-inorganic perovskite compound, without impairing the effects of the present invention. In this context, the organic semiconductor or the inorganic semiconductor may play a role as an electron transport layer or a hole transport layer mentioned later.

Examples of the organic semiconductor include compounds having a thiophene skeleton, such as poly(3-alkylthiophene). Examples thereof also include conductive polymers having a poly-p-phenylenevinylene skeleton, a polyvinylcarbazole skeleton, a polyaniline skeleton, a polyacetylene skeleton or the like. Examples thereof further include: compounds having a phthalocyanine skeleton, a naphthalocyanine skeleton, a pentacene skeleton, a porphyrin skeleton such as a benzoporphyrin skeleton, a spirobifluorene skeleton or the like; and carbon-containing materials such as carbon nanotube, graphene, and fullerene, which may be surface-modified.

Examples of the inorganic semiconductor include titanium oxide, zinc oxide, indium oxide, tin oxide, gallium oxide, tin sulfide, indium sulfide, zinc sulfide, CuSCN, Cu$_2$O, CuI, MoO$_3$, V$_2$O$_5$, WO$_3$, MoS$_2$, MoSe$_2$ and Cu$_2$S.

The photoelectric conversion layer including the organic semiconductor or the inorganic semiconductor may be a laminated structure where a thin film-shaped organic semiconductor or inorganic semiconductor part and a thin film-shaped organic-inorganic perovskite compound part are laminated, or may be a composite structure where an organic semiconductor or inorganic semiconductor part and an organic-inorganic perovskite compound part are combined. The laminated structure is preferred from the viewpoint that the production process is simple. The composite structure is preferred from the viewpoint that the charge separation efficiency of the organic semiconductor or the inorganic semiconductor can be improved.

The lower limit of the thickness of the thin film-shaped organic-inorganic perovskite compound part is preferably 5 nm, and the upper limit thereof is preferably 5,000 nm. When the thickness is 5 nm or larger, light can be sufficiently absorbed, enhancing the photoelectric conversion efficiency. When the thickness is 5,000 nm or smaller, presence of a region in which charge separation cannot be achieved can be avoided, leading to higher photoelectric conversion efficiency. The lower limit of the thickness is more preferably 10 nm, and the upper limit thereof is more preferably 1,000 nm. The lower limit of the thickness is further preferably 20 nm, and the upper limit thereof is further preferably 500 nm.

When the photoelectric conversion layer is a composite structure where an organic semiconductor or inorganic semiconductor part and an organic-inorganic perovskite compound part are combined, the lower limit of the thickness of the composite structure is preferably 30 nm, and the upper limit thereof is preferably 3,000 nm. When the thickness is 30 nm or larger, light can be sufficiently absorbed, enhancing the photoelectric conversion efficiency. When the thickness is 3,000 nm or smaller, charge easily arrives at the electrode, enhancing the photoelectric conversion efficiency. The lower limit of the thickness is more preferably 40 nm, and the upper limit thereof is more preferably 2,000 nm. The lower limit of the thickness is further preferably 50 nm, and the upper limit thereof is further preferably 1,000 nm.

In the laminate, an electron transport layer may be disposed between the electrode and the photoelectric conversion layer.

Examples of the material of the electron transport layer include, but are not particularly limited to, N-type conductive polymers, N-type low-molecular organic semiconductors, N-type metal oxides, N-type metal sulfides, alkali metal halides, alkali metals, and surfactants. Specific examples thereof include cyano group-containing polyphenylenevinylene, boron-containing polymers, bathocuproine, bathophenanthroline, hydroxyquinolinatoaluminum, oxadiazole compounds, benzimidazole compounds, naphthalenetetracarboxylic acid compounds, perylene derivatives, phosphine oxide compounds, phosphine sulfide compounds, fluoro group-containing phthalocyanine, titanium oxide, zinc oxide, indium oxide, tin oxide, gallium oxide, tin sulfide, indium sulfide, and zinc sulfide.

The electron transport layer may consist only of a thin film-shaped electron transport layer and preferably includes a porous electron transport layer. Particularly, when the photoelectric conversion layer is a composite structure where an organic semiconductor or inorganic semiconductor part and an organic-inorganic perovskite compound part are combined, a film of the composite structure is preferably formed on a porous electron transport layer because a more complicated composite structure (more intricate structure) is obtained, enhancing the photoelectric conversion efficiency.

The lower limit of the thickness of the electron transport layer is preferably 1 nm, and the upper limit thereof is preferably 2,000 nm. When the thickness is 1 nm or larger, holes can be sufficiently blocked. When the thickness is 2,000 nm or smaller, the layer is less likely to be the resistance to the electron transport, enhancing the photoelectric conversion efficiency. The lower limit of the thickness of the electron transport layer is more preferably 3 nm, and the upper limit thereof is more preferably 1,000 nm. The lower limit of the thickness is further preferably 5 nm, and the upper limit thereof is further preferably 500 nm.

In the laminate, a hole transport layer may be disposed between the counter electrode and the photoelectric conversion layer.

Examples of the material of the hole transport layer include, but are not particularly limited to, P-type conductive polymers, P-type low-molecular organic semiconductors, P-type metal oxides, P-type metal sulfides, and surfactants. Specific examples thereof include polystyrenesulfonic acid adducts of polyethylenedioxythiophene, carboxyl group-containing polythiophene, phthalocyanine, porphyrin, molybdenum oxide, vanadium oxide, tungsten oxide, nickel oxide, copper oxide, tin oxide, molybdenum sulfide, tungsten sulfide, copper sulfide, tin sulfide, fluoro group-containing phosphonic acid, carbonyl group-containing phosphonic acid, copper compounds such as CuSCN and CuI, and carbon-containing materials such as carbon nanotube and graphene, which may be surface-modified.

The lower limit of the thickness of the hole transport layer is preferably 1 nm, and the upper limit thereof is preferably 2,000 nm. When the thickness is 1 nm or larger, electrons can be sufficiently blocked. When the thickness is 2,000 nm or smaller, the layer is less likely to be the resistance to the hole transport, enhancing the photoelectric conversion efficiency. The lower limit of the thickness is more preferably 3 nm, and the upper limit thereof is more preferably 1,000 nm. The lower limit of the thickness is further preferably 5 nm, and the upper limit thereof is further preferably 500 nm.

The laminate may further have a substrate or the like. Examples of the substrate include, but are not particularly limited to, transparent glass substrates such as soda lime glass and alkali-free glass substrates, ceramic substrates and transparent plastic substrates.

In the solar cell of the present invention, the laminate is encapsulated with an encapsulation material. Encapsulation of the laminate with the encapsulation material can improve the durability of the solar cell. This is probably because encapsulation with the encapsulation material can suppress moisture penetration into the inside. In this context, the encapsulation material preferably covers the laminate entirely so as to close the end portions thereof. This can reliably prevent moisture penetration into the inside.

Either electrode side or counter electrode side of the laminate may be covered with an encapsulation material as long as the laminate is encapsulated with the encapsulation material.

The encapsulation material includes a resin having at least one skeleton selected from the group consisting of polyisobutylene, polyisoprene, and polybutadiene (hereinafter, also referred to as a "resin having a polyisobutylene skeleton or the like").

When the organic-inorganic perovskite compound is used in the photoelectric conversion layer, during encapsulation, an organic component in the organic-inorganic perovskite compound is dissolved into the encapsulation material so that the organic-inorganic perovskite compound is degraded (initial degradation). By contrast, in the solar cell of the present invention, use of the resin having a polyisobutylene skeleton or the like as the encapsulation material can prevent elution of an organic component in the organic-inorganic perovskite compound during encapsulation and thus prevent degradation of the photoelectric conversion layer, even when the organic-inorganic perovskite compound is used in the photoelectric conversion layer.

Moreover, the resin having a polyisobutylene skeleton or the like has a higher water vapor barrier property than other resins such as silicone resins, and therefore, use of the resin having a polyisobutylene skeleton or the like as the encapsulation material can improve high-humidity durability of the resulting solar cell. In addition, the resin having a polyisobutylene skeleton or the like exhibits high adhesion to an adherend over a wider temperature range than that in the case of other resins such as norbornene resins, and therefore, use of the resin having a polyisobutylene skeleton or the like for the encapsulation material can improve temperature cycle resistance of the resulting solar cell. In addition, use of the resin having a polyisobutylene skeleton or the like as the encapsulation material can suppress time-dependent molecular diffusion and can therefore improve the heat-resistant durability of the solar cell.

The resin having a polyisoburelene skeleton or the like is not limited as long as it has at least one skeleton selected from the group consisting of polyisobutylene, polyisoprene, and polybutadiene, and may be either a homopolymer or a copolymer. For example, it may be a polyisobutylene resin, polyisoprene resin, polybutadiene resin, butadiene rubber, styrene-butadiene copolymer (SBR resin), polymer of both-end hydroxy-terminated polyisoprene and isocyanate, or polymer of both-end acrylic-modified polybutadiene. These resins having a polyisobutylene skeleton or the like may be used alone, or in combination of two or more thereof. For its high water vapor barrier property, preferred among these is a polyisobutylene resin.

Alternatively, the resin having a polyisoburelene skeleton or the like may be a resin obtained by forming a film of a compound having a reactive functional group, followed by a cross-linking reaction of the reactive functional group using a cross-linking agent. Examples of the reactive functional group include an epoxy group, a hydroxy group, a carboxyl group, an alkenyl group and an isocyanate group. The cross-linking agent is not particularly limited, and the cross-linking reaction of the reactive functional group can be initiated using a catalyst or the like. In this case, adjustment of the number of the reactive functional groups suppresses degradation (initial degradation) of the solar cell during encapsulation thereof due to curing shrinkage accompanying the crosslinking reaction.

Specific examples of the resin having a polyisoburelene skeleton or the like include OPPANOL series (available from BASF SE, having a polyisobutylene skeleton), TETRAX series (available from JX Nippon Oil & Energy Corporation, having a polyisobutylene skeleton), polymers (having a polybutadiene skeleton) of NISSO PB series (available from Nippon Soda Co., Ltd.), and polymers (having a polyisoprene skeleton) of Poly ip (available from Idemitsu Kosan Co., Ltd.).

The lower limit of the thickness of the encapsulation material is preferably 100 nm, and the upper limit thereof is preferably 100,000 nm. The lower limit of the thickness is more preferably 500 nm, and the upper limit thereof is more preferably 50,000 nm. The lower limit of the thickness is further preferably 1,000 nm, and the upper limit thereof is further preferably 20,000 nm.

Preferably, the solar cell of the present invention further includes an inorganic layer on the encapsulation material. Having a water vapor barrier property, the inorganic layer can suppress moisture penetration into the inside and can therefore further improve the high-humidity durability of the solar cell.

Also preferably, the solar cell of the present invention further includes an inorganic layer between the laminate and the encapsulation material. In this case as well, having a water vapor barrier property, the inorganic layer can suppress moisture penetration into the inside and can therefore further improve the high-humidity durability of the solar cell.

The inorganic layer preferably contains a metal oxide, a metal nitride, or a metal oxynitride.

The metal oxide, metal nitride, or metal oxynitride is not particularly limited as long as it has a water vapor barrier property. Examples thereof include an oxide, nitride, or oxynitride of Si, Al, Zn, Sn, In, Ti, Mg, Zr, Ni, Ta, W, Cu, or an alloy containing two or more of them. Among them, an oxide, nitride, or oxynitride of Si, Al, Zn, or Sn is preferred, and an oxide, nitride, or oxynitride of Zn or Sn is more preferred. An oxide, a nitride, or an oxynitride of metal elements including both of the metal elements Zn and Sn is further preferred because a particularly high water vapor barrier property and plasticity can be imparted to the inorganic layer.

Among others, the metal oxide, metal nitride, or metal oxynitride is particularly preferably a metal oxide represented by the formula $Zn_aSn_bO_c$. In this formula, a, b and c each represent a positive integer.

Use of the metal oxide represented by the formula $Zn_aSn_bO_c$ in the inorganic layer can impart moderate flexibility to the inorganic layer because the metal oxide contains a tin (Sn) atom, so that stress is decreased even when the thickness of the inorganic layer is increased. Therefore, peeling of the inorganic layer, electrode, semiconductor layer, and the like can be suppressed. This can enhance the water vapor barrier property of the inorganic layer and further improve the durability of the solar cell. Meanwhile, the inorganic layer can exert a particularly high barrier property because the metal oxide contains a zinc (Zn) atom.

In the metal oxide represented by the formula $Zn_aSn_bO_c$, the ratio Xs (% by weight) of Sn to the total sum of Zn and Sn preferably satisfies 70>Xs>0. Also, value Y represented by Y=c/(a+2b) preferably satisfies 1.5>Y>0.5.

The element ratios of zinc (Zn), tin (Sn), and oxygen (O) contained in the metal oxide represented by the formula $Zn_aSn_bO_c$ in the inorganic layer can be measured using an X-ray photoemission spectroscopy (XPS) surface analyzer (e.g., ESCALAB-200R available from VG Scientific).

Preferably, the inorganic layer containing the metal oxide represented by the formula $Zn_aSn_bO_c$ further contains silicon (Si) and/or aluminum (Al).

The addition of silicon (Si) and/or aluminum (Al) to the inorganic layer can enhance the transparency of the inorganic layer and improve the photoelectric conversion efficiency of the solar cell.

The lower limit of the thickness of the inorganic layer is preferably 30 nm, and the upper limit thereof is preferably 3,000 nm. When the thickness is 30 nm or larger, the inorganic layer can have an adequate water vapor barrier property, improving the durability of the solar cell. When the thickness is 3,000 nm or smaller, only small stress is generated even when the thickness of the inorganic layer is increased. Therefore, peeling of the inorganic layer, electrode, semiconductor layer, and the like can be suppressed.

The lower limit of the thickness is more preferably 50 nm, and the upper limit thereof is more preferably 1,000 nm. The lower limit of the thickness is further preferably 100 nm, and the upper limit thereof is further preferably 500 nm.

The thickness of the inorganic layer can be measured using an optical interference-type film thickness measurement apparatus (e.g., FE-3000 available from Otsuka Electronics Co., Ltd.).

In the solar cell of the present invention, the encapsulation material may be further covered with, for example, an additional material such as a glass sheet, resin film, inorganic material-coated resin film, or metal (e.g., aluminum) foil. Specifically, the solar cell of the present invention may be configured such that encapsulation, filling, or bonding between the laminate and the additional material is attained by the encapsulation material. This can sufficiently block water vapor even when a pinhole is present in the encapsulation material, and can further improve the high-humidity durability of the solar cell. Among them, an inorganic material-coated resin film is more preferably disposed thereon.

Figure 2:
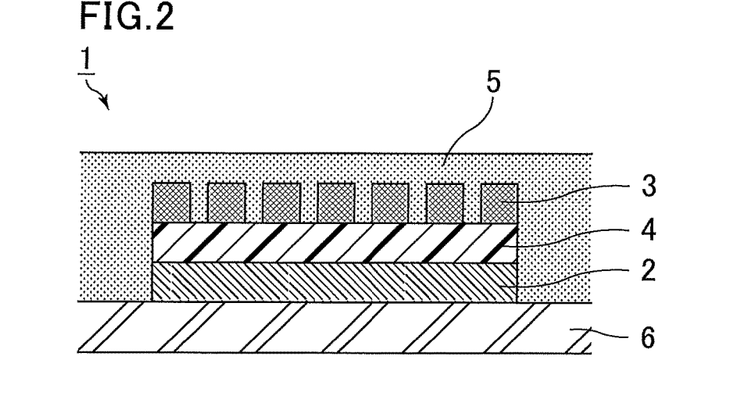
FIG. 2 is a cross-sectional view schematically illustrating an exemplary solar cell of the present invention.

FIG. 2 is a cross-sectional view schematically illustrating an exemplary solar cell of the present invention.

In a solar cell 1 shown in FIG. 2, a laminate having, on a substrate 6, an electrode 2, a counter electrode 3, and a photoelectric conversion layer 4 disposed between the electrode 2 and the counter electrode 3 is encapsulated with an encapsulation material 5 that covers the counter electrode 3. In this context, the end portions of the encapsulation material 5 are closed by intimate contact with the substrate 6. In the solar cell 1 shown in FIG. 2, the counter electrode 3 is a patterned electrode. An inorganic layer (not shown) may be disposed between the laminate and the encapsulation material 5 or on the encapsulation material 5.

Examples of the method for producing the solar cell of the present invention include, but are not particularly limited to, a method which involves forming the electrode, the photoelectric conversion layer, and the counter electrode in this order on the substrate to prepare a laminate, then encapsulating the laminate with the encapsulation material, and further covering the encapsulation material with an inorganic layer.

Examples of the method for forming the photoelectric conversion layer include, but are not particularly limited to, a vapor deposition method, a sputtering method, a chemical vapor deposition (CVD) method, an electrochemical deposition method, and a printing method. Among them, employment of a printing method allows simple formation of a large-area solar cell that can exhibit high photoelectric conversion efficiency. Examples of the printing method include a spin coating method and a casting method. Examples of the method using the printing method include a roll-to-roll method.

Examples of the method for encapsulating the laminate with the encapsulation material include, but are not particularly limited to, a method which involves sealing the laminate using a sheet-shaped encapsulation material, a method which involves applying an encapsulation material solution containing the encapsulation material dissolved in an organic solvent to the laminate, a method which involves applying a compound having a reactive functional group to be the encapsulation material to the laminate, followed by cross-linking or polymerization of the compound having a reactive functional group using heat, UV, or the like, and a method which involves melting the encapsulation material under heat, followed by cooling.

The method for covering the encapsulation material with the inorganic layer is preferably a vacuum deposition method, a sputtering method, a chemical vapor deposition (CVD) method, or an ion plating method. Among them, a sputtering method is preferred for forming a dense layer. The sputtering method is more preferably a DC magnetron sputtering method.

In the sputtering method, the inorganic layer can be formed by depositing raw materials including a metal target and oxygen gas or nitrogen gas on the encapsulation material for film formation.

Advantageous Effects of Invention

The present invention can provide a solar cell that is excellent in photoelectric conversion efficiency, suffers little degradation during encapsulation (initial degradation), has high-humidity durability, and is excellent in temperature cycle resistance.

DESCRIPTION OF EMBODIMENTS

Hereinafter, the present invention will be described in more detail with reference to Examples. However, the present invention is not intended to be limited by these Examples.

Example 1

(Preparation of Laminate)

A FTO film having a thickness of 1,000 nm was formed as an electrode on a glass substrate, ultrasonically washed with pure water, acetone, and methanol each for ten minutes in the stated order, and then dried.

An ethanol solution of titanium isopropoxide adjusted to 2% was applied onto the surface of the FTO film by the spin coating method and then fired at 400° C. for 10 minutes to form a thin film-shaped electron transport layer having a thickness of 20 nm. A titanium oxide paste containing polyisobutyl methacrylate as an organic binder and titanium oxide (mixture of powders having average particle sizes of 10 nm and 30 nm) was further applied onto the thin film-shaped electron transport layer by the spin coating method and then fired at 500° C. for 10 minutes to form a porous electron transport layer having a thickness of 500 nm.

Subsequently, $CH_3NH_3I$ and $PbI_2$ were dissolved at a molar ratio of 1:1 in N,N-dimethylformamide (DMF) as a solvent to prepare a solution for organic-inorganic perovskite compound formation having a total concentration of $CH_3NH_3I$ and $PbI_2$ of 20% by weight. This solution was laminated onto the electron transport layer by the spin coating method to form a photoelectric conversion layer.

Further, 68 mM spiro-OMeTAD (having a spirobifluorene skeleton), 55 mM tert-butylpyridine and 9 mM lithium bis(trifluoromethylsufonyl)imide salt were dissolved in 25 μL of chlorobenzene to prepare a solution. This solution was laminated to a thickness of 300 nm onto the photoelectric conversion layer by the spin coating method to form a hole transport layer.

A gold film having a thickness of 100 nm was formed as a counter electrode on the hole transport layer by vacuum deposition to obtain a laminate.

(Encapsulation of Laminate)

To the obtained laminate, a solution of a resin having a polyisobutylene skeleton (OPPANOL B 50, available from BASF SE) in cyclohexane is applied by spin coating, and dried at 100° C. for 10 minutes to form an encapsulation material having a thickness of 10 μm. A solar cell was thus prepared.

Examples 2 to 5

A solar cell was obtained in the same manner as in Example 1, except that in preparation of the laminate, the components contained in the solution for organic-inorganic perovskite compound formation was changed to form a photoelectric conversion layer (organic-inorganic perovskite compound) shown in Table 1.

In Example 2, $CH_3NH_3Br$, $CH_3NH_3I$, $PbBr_2$, and $PbI_2$ were dissolved at a molar ratio of 1:2:1:2 in N,N-dimethylformamide (DMF) as a solvent. In Example 3, $CH_3NH_3I$ and $PbCl_2$ were dissolved at a molar ratio of 3:1 in N,N-dimethylformamide (DMF) as a solvent. In Example 4, $CH_3NH_3Br$ and $PbBr_2$ were dissolved at a molar ratio of 1:1 in N,N-dimethylformamide (DMF) as a solvent. In Example 5, $CH_3(NH_3)_2I$ and $PbI_2$ were dissolved at a molar ratio of 1:1 in N,N-dimethylformamide (DMF) as a solvent.

Example 6

A solar cell was obtained in the same manner as in Example 1, except that in encapsulation of the laminate, the encapsulation material thickness was changed as shown in Table 1.

Examples 7 to 10

A solar cell was obtained in the same manner as in Example 1, except that in encapsulation of the laminate, the encapsulation material was changed to that shown in Table 1.

In Example 7, a resin having a polyisobutylene skeleton (OPPANOL B 100, available from BASF SE) was used.

In Example 8, to the laminate, a mixture containing 4 mol % of a peroxide (PERCUMYL D, available from NOF Corporation) as a curing agent and a liquid monomer (acrylate having a butadiene skeleton, NISSO PB GI-3000, available from Nippon Soda Co., Ltd.) which is to be an encapsulation material was applied and then heated at 120° C. for one hour for polymerization of the liquid monomer.

In Example 9, a resin having a polyisoprene skeleton (available from Wako Pure Chemical Industries, Ltd.) was used.

In Example 10, a resin having a polybutadiene skeleton (available from Ube Industries, Ltd.) was used.

Examples 11 to 13

A solar cell was obtained in the same manner as in Example 1, except that the encapsulation material was laminated after formation of the inorganic layer shown in Table 1 on the laminate.

(Method for Forming Inorganic Layer)

The obtained laminate was set in a substrate holder of a sputtering device. In addition, a ZnSn alloy (Zn:Sn=95:5 (% by weight)) target was mounted on cathode A of the sputtering device, and a Si target was mounted on cathode B of the sputtering device. A film-forming chamber of the sputtering device was exhausted using a vacuum pump to reduce the pressure to $5.0 \times 10^{-4}$ Pa. Then, sputtering was performed under the sputtering condition A to form a thin film of ZnSnO(Si) having a thickness of 100 nm as an inorganic layer on the laminate.

<Sputtering Condition A>

Argon gas flow rate: 50 sccm, oxygen gas flow rate: 50 sccm

Power output: cathode A=500 W, cathode B=1500 W

In Example 11, a Si target was used as a metal target. In Example 12, a Sn target was used as a metal target.

Examples 14 and 15

A solar cell was obtained in the same manner as in Example 1, except that in encapsulation of the laminate, the encapsulation material was changed to that shown in Table 1.

In Example 14, the encapsulation material used was a mixture of a resin having a polyisobutylene skeleton (OPPANOL B 100, available from BASF SE) and a norbornene resin (TOPAS6015, available from Polyplastics Co., Ltd.) mixed at a weight ratio of 5:5.

In Example 15, the encapsulation material used was a mixture of a resin having a polyisobutylene skeleton (OPPANOL B 100, available from BASF SE) and a norbornene resin (TOPAS6015, available from Polyplastics Co., Ltd.) mixed at a weight ratio of 2:8.

Comparative Examples 1 to 4

A solar cell was obtained in the same manner as in Example 1, except that in encapsulation of the laminate, the encapsulation material was changed to that shown in Table 1.

In Comparative Example 1, polyvinyl alcohol (PVA) (available from Wako Pure Chemical Industries, Ltd.) was used as the encapsulation material. In Comparative Example 2, the laminate was laminated with aluminum foil on which a mixture containing 4 mol % of an imidazole compound 2MZA (available from Shikoku Chemicals Corporation) as a curing agent and a bisphenol A epoxy resin (available from Mitsubishi Chemical Corporation) was stacked at 100° C., followed by curing with heat at 120° C. for one hour. In Comparative Example 3, a silicone resin not having a polyisobutylene skeleton or the like was used, and the laminate was laminated with aluminum foil on which the silicone resin was stacked, followed by curing with heat at 120° C. for one hour. In Comparative Example 4, a norbornene resin (TOPAS6015, available from Polyplastics Co., Ltd.) was used.

The silicone resin was prepared by polymerization as described below.

A 1000-mL separable flask equipped with a thermometer, a dripping device, and a stirrer was charged with 164.1 g of dimethyldimethoxysilane, 6.6 g of methylvinyldimethoxysilane, and 4.7 g of 1,3-divinyl-1,1,3,3-tetramethyldisiloxane, and they were stirred at 50° C. To the mixture was dripped slowly a solution prepared by dissolving 2.2 g of potassium hydroxide in 35.1 g of water. After the dripping, the mixture was stirred at 50° C. for six hours to be reacted. A reaction solution was thus prepared. Next, volatile components were removed by depressurization, and 2.4 g of acetic acid was added to the reaction solution. The resulting reaction solution was heated under reduced pressure. Then, potassium acetate was filtered off, thereby preparing a polymer A.

Separately, a 1000-mL separable flask equipped with a thermometer, a dripping device, and a stirrer was charged with 80.6 g of dimethyldimethoxysilane and 45 g of 1,1,3,3-tetramethyldisiloxane, and they were stirred at 50° C. To the mixture was dripped slowly a solution prepared by blending 100 g of acetic acid with 27 g of water. After the dripping, the mixture was stirred at 50° C. for six hours to be reacted. A reaction solution was thus prepared. Next, volatile components were removed by depressurization, thereby preparing a polymer. The obtained polymer was blended with 150 g of hexane and 150 g of ethyl acetate, and washed with 300 g of ion exchange water ten times. Volatile components therein were removed by depressurization, thereby preparing a polymer B.

An amount of 90 parts by weight of the polymer A, 12 parts by weight of the polymer B, and 0.2% by weight of a hydrosilylation catalyst (platinum-1,3-divinyl-1,1,3,3-tetramethyldisiloxane complex) were mixed to prepare a silicone resin.

Comparative Example 5

A solar cell was obtained in the same manner as in Example 1, except that encapsulation of the laminate was not performed.

<Evaluation>

The solar cells obtained in Examples and Comparative Examples were evaluated as described below.

(1) Degradation During Encapsulation (Initial Degradation)

A power source (236 model, available from Keithley Instruments, Inc.) was connected between the electrodes in the laminate before encapsulation. The photoelectric conversion efficiency was measured using a solar simulator (available from Yamashita Denso Corp.) having an intensity of 100 mW/cm$^2$, and the obtained value was taken as the initial conversion efficiency.

A power source (236 model, available from Keithley Instruments, Inc.) was connected between the electrodes in the solar cell immediately after encapsulation. The photoelectric conversion efficiency was measured using a solar simulator (available from Yamashita Denso Corp.) having an intensity of 100 mW/cm$^2$ to determine the value of photoelectric conversion efficiency immediately after encapsulation/initial conversion efficiency.

○ (Good): The value of photoelectric conversion efficiency immediately after encapsulation/initial conversion efficiency was 0.5 or more.

x (Poor): The value of photoelectric conversion efficiency immediately after encapsulation/initial conversion efficiency was less than 0.5.

(2) High-Humidity Durability

The solar cell was left for 24 hours under conditions of 70% and 30° C. to conduct a high-humidity durability test. A power source (236 model, available from Keithley Instruments, Inc.) was connected between the electrodes in the solar cell after the high-humidity durability test. The photoelectric conversion efficiency was measured using a solar simulator (available from Yamashita Denso Corp.) having an intensity of 100 mW/cm$^2$, and the value of photoelectric conversion efficiency after the high-humidity durability test/photoelectric conversion efficiency immediately after encapsulation was determined.

○○ (Excellent): The value of photoelectric conversion efficiency after the high-humidity durability test/photoelectric conversion efficiency immediately after encapsulation was 0.9 or more.

○ (Good): The value of photoelectric conversion efficiency after the high-humidity durability test/photoelectric conversion efficiency immediately after encapsulation was 0.5 or more and less than 0.9.

x (Poor): The value of photoelectric conversion efficiency after the high-humidity durability test/photoelectric conversion efficiency immediately after encapsulation was less than 0.5.

(3) Temperature Cycle Resistance

In a temperature cycle test, the solar cell obtained in each of Examples 1 to 12 and Comparative Examples 3, 4, and 6 was subjected to 300 cycles of temperature cycling from −55° C. to 125° C. A power source (236 model, available from Keithley Instruments, Inc.) was connected between the electrodes in the solar cell after the temperature cycle test. The photoelectric conversion efficiency was measured using a solar simulator (available from Yamashita Denso Corp.) having an intensity of 100 mW/cm$^2$ to determine the value of photoelectric conversion efficiency after the temperature cycle test/photoelectric conversion efficiency immediately after encapsulation.

○ (Good): The value of photoelectric conversion efficiency after the temperature cycle test/photoelectric conversion efficiency immediately after encapsulation was 0.5 or more.

x (Poor): The value of photoelectric conversion efficiency after the temperature cycle test/photoelectric conversion efficiency immediately after encapsulation was less than 0.5.

TABLE 1

| | | | Thickness of encapsulation material (μm) | Inorganic layer | | | Evaluation | | |
|---|---|---|---|---|---|---|---|---|---|
| | Photoelectric conversion layer | Encapsulation material | | Material | Thickness (nm) | Solar cell structure | Initial degradation | High-humidity durability | Temperature cycle resistance |
| Example 1 | $CH_3NH_3PbI_3$ | Polyisobutylene | 10 | Not used | — | Counter electrode/encapsulation material | ○ | ○ | ○ |
| Example 2 | $CH_3NH_3PbI_2Br$ | Polyisobutylene | 10 | Not used | — | Counter electrode/encapsulation material | ○ | ○ | ○ |
| Example 3 | $CH_3NH_3PbI_2Cl$ | Polyisobutylene | 10 | Not used | — | Counter electrode/encapsulation material | ○ | ○ | ○ |
| Example 4 | $CH_3NH_3PbBr_3$ | Polyisobutylene | 10 | Not used | — | Counter electrode/encapsulation material | ○ | ○ | ○ |
| Example 5 | $CH_3(NH_3)_2PbI_3$ | Polyisobutylene | 10 | Not used | — | Counter electrode/encapsulation material | ○ | ○ | ○ |
| Example 6 | $CH_3NH_3PbI_3$ | Polyisobutylene | 5 | Not used | — | Counter electrode/encapsulation material | ○ | ○ | ○ |
| Example 7 | $CH_3NH_3PbI_3$ | Polyisobutylene | 10 | Not used | — | Counter electrode/encapsulation material | ○ | ○ | ○ |
| Example 8 | $CH_3NH_3PbI_3$ | Polybutadiene acrylate polymer | 10 | Not used | — | Counter electrode/encapsulation material | ○ | ○ | ○ |

TABLE 1-continued

| | Photoelectric conversion layer | Encapsulation material | Thickness of encapsulation material (μm) | Inorganic layer Material | Inorganic layer Thickness (nm) | Solar cell structure | Initial degradation | High-humidity durability | Temperature cycle resistance |
|---|---|---|---|---|---|---|---|---|---|
| Example 9 | $CH_3NH_3PbI_3$ | Polyisoprene | 10 | Not used | — | Counter electrode/encapsulation material | ○ | ○ | ○ |
| Example 10 | $CH_3NH_3PbI_3$ | Polybutadiene | 10 | Not used | — | Counter electrode/encapsulation material | ○ | ○ | ○ |
| Example 11 | $CH_3NH_3PbI_3$ | Polyisobutylene | 10 | ZnSnO(Si) | 100 | Counter electrode/inorganic layer/encapsulation material | ○ | ○○ | ○ |
| Example 12 | $CH_3NH_3PbI_3$ | Polyisobutylene | 10 | $SiO_2$ | 100 | Counter electrode/inorganic layer/encapsulation material | ○ | ○○ | ○ |
| Example 13 | $CH_3NH_3PbI_3$ | Polyisobutylene | 10 | $SnO_2$ | 100 | Counter electrode/inorganic layer/encapsulation material | ○ | ○○ | ○ |
| Example 14 | $CH_3NH_3PbI_3$ | Polyisobutylene/norbomene resin | 10 | Not used | — | Counter electrode/encapsulation material | ○ | ○ | ○ |
| Example 15 | $CH_3NH_3PbI_3$ | Polyisobutylene/norbomene resin | 10 | Not used | — | Counter electrode/encapsulation material | ○ | ○ | ○ |
| Comparative Example 1 | $CH_3NH_3PbI_3$ | PVA | 10 | Not used | — | Counter electrode/encapsulation material | x | x | — |
| Comparative Example 2 | $CH_3NH_3PbI_3$ | Epoxy resin | 10 | Not used | — | Counter electrode/encapsulation material | x | ○ | — |
| Comparative Example 3 | $CH_3NH_3PbI_3$ | Silicone resin | 10 | Not used | — | Counter electrode/encapsulation material | ○ | x | ○ |
| Comparative Example 4 | $CH_3NH_3PbI_3$ | Norbomene resin | 10 | Not used | — | Counter electrode/encapsulation material | ○ | ○ | x |
| Comparative Example 5 | $CH_3NH_3PbI_3$ | Not used | — | Not used | — | Counter electrode | — | — | x |

INDUSTRIAL APPLICABILITY

The present invention can provide a solar cell that is excellent in photoelectric conversion efficiency, suffers little degradation during encapsulation (initial degradation), has high-humidity durability, and is excellent in temperature cycle resistance.

REFERENCE SIGNS LIST 1. solar cell
2. electrode
3. counter electrode (patterned electrode)
4. photoelectric conversion layer
5. encapsulation material
6. substrate

The invention claimed is:

1. A solar cell comprising:
   a laminate having an electrode, a counter electrode, and a photoelectric conversion layer disposed between the electrode and the counter electrode; and
   an encapsulation material covering the counter electrode to encapsulate the laminate,
   the photoelectric conversion layer including an organic-inorganic perovskite compound represented by the formula: $R-M-X_3$, R representing an organic molecule, M representing a metal atom, X representing a halogen atom or a chalcogen atom, and
   the encapsulation material including a resin having at least one skeleton selected from the group consisting of polyisobutylene and polyisoprene,
   wherein after subjecting the solar cell to 300 cycles of temperature cycling from −55° C. to 125° C. (temperature cycle test), the value of photoelectric conversion efficiency of the solar cell after the temperature cycle test/photoelectric conversion efficiency immediately after encapsulation was 0.5 or more, and
   wherein after leaving the solar cell for 24 hours under conditions of 70% humidity and 30° C. (high-humidity durability test), the value of photoelectric conversion efficiency of the solar cell after the high-humidity durability test/photoelectric conversion efficiency immediately after encapsulation was 0.5 or more.

2. The solar cell according to claim 1,
   wherein the solar cell further includes an inorganic layer between the laminate and the encapsulation material, and
   the inorganic layer contains a metal oxide, a metal nitride, or a metal oxynitride.

3. The solar cell according to claim 1,
   wherein the solar cell further includes an inorganic layer on the encapsulation material, and the inorganic layer contains a metal oxide, a metal nitride, or a metal oxynitride.

* * * * *